United States Patent
Seo et al.

(10) Patent No.: US 6,657,915 B2
(45) Date of Patent: Dec. 2, 2003

(54) WORDLINE DRIVER FOR ENSURING EQUAL STRESS TO WORDLINES IN MULTI ROW ADDRESS DISTURB TEST AND METHOD OF DRIVING THE WORDLINE DRIVER

(75) Inventors: Young-soon Seo, Yongin (KR); Tae-sik Son, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 3 days.

(21) Appl. No.: 10/001,203

(22) Filed: Dec. 4, 2001

(65) Prior Publication Data

US 2002/0067644 A1 Jun. 6, 2002

(30) Foreign Application Priority Data

Dec. 6, 2000 (KR) ........................................ 2000-73802

(51) Int. Cl.[7] ................................................. G11C 8/00
(52) U.S. Cl. ................................... 365/230.06; 365/201
(58) Field of Search ...................... 365/230.06, 230.03, 365/230.08, 201, 51, 189.09, 200, 185.2

(56) References Cited

U.S. PATENT DOCUMENTS 6,049,503 A  * 4/2000 Khang .................. 365/230.06
6,185,135 B1 * 2/2001 Netis et al. ................ 365/194
6,229,755 B1 * 5/2001 Oh ........................ 365/230.06

* cited by examiner

Primary Examiner—David Nelms
Assistant Examiner—Gene N Auduong

(57) ABSTRACT

A wordline driver and method that applies equal stress to wordlines in a multi-row address disturb (MRAD) test. The wordline driver includes a controller, a decoder and a sub-wordline driver. The controller generates a decoder control signal from a signal among input address decoding signals, responsive to an MRAD mode signal. The decoder generates a normal wordline enable signal responsive to the address decoding signals and the decoder control signal. The sub-wordline driver combines the address decoding signals responsive to a normal wordline enable signal and drives the sub-wordline signal as a wordline responsive to a normal wordline enable signal. Consequently, in the MRAD mode, the wordline enable signal is generated later than the sub-wordline signal. Also, the voltage level of the wordlines enabled in the MRAD mode are substantially equivalent, to prevent over stressing of a first enabled wordline from self-boosting.

11 Claims, 5 Drawing Sheets

US 6,657,915 B2

WORDLINE DRIVER FOR ENSURING EQUAL STRESS TO WORDLINES IN MULTI ROW ADDRESS DISTURB TEST AND METHOD OF DRIVING THE WORDLINE DRIVER

The present application claims priority under 35 U.S.C. §119 to Korean Patent Application No. 2000-73802 filed on Dec. 6, 2000, which is hereby incorporated by reference in its entirety for all purposes.

BACKGROUND OF THE INVENTION

1. Field of the Invention

The present invention relates to a semiconductor memory device, and more particularly, to a wordline driver for ensuring equal stress to wordlines in a multi row address disturb test and a method of driving the wordline driver.

2. Description of the Related Art

As the storage capacity of semiconductor memory devices increases, the time required to test semiconductor memory devices increases. To reduce the test time, particularly for a dynamic random access memory, a method of enabling a plurality of wordlines simultaneously is sometimes used instead of a method of enabling one wordline for the test. The process in which one wordline is enabled to sense a memory cell data is called a "disturb", and the process in which a plurality of wordlines are enabled to sense the data of a plurality of memory cells simultaneously, is called a multi-row address disturb (MRAD). Therefore, the MRAD mode is advantageous in reducing the time required to test a semiconductor memory device in comparison to the disturb mode.

The structure of a circuit enabling wordlines and the operation timing diagram thereof are illustrated in FIGS. 1 through 4. FIG. 1 is a diagram illustrating a conventional row address pre-decoder 100. The row address pre-decoder 100 combines externally input row addresses RA0 through RA11 and then generates address decoding signals DRA01 through DRA91011. The address decoding signal DRA01 is a signal made by combining the row addresses RA0 and RA1. The address decoding signal DRA234 is a signal made by combining the row addresses RA2, RA3, and RA4. The address decoding signals DRA56, is made by combining the row address signals RA5 and RA6, and the address decoding signals DRA78 is made by combining the row address signals RA7 and RA8. Finally, the address decoding signal DRA91011 is made by combining the row address signals RA9, RA10 and RA11.

FIG. 2 is a diagram illustrating a sub-wordline decoder 200. The sub-wordline decoder 200 generates sub-wordline signals PXi and PXiB through the combination of the address decoding signals DRA01 and DRA91011. As the sub-wordline decoder is driven by a boosting voltage Vpp, the voltage level of the sub wordline signals PXi and PXiB appears to be the boosting voltage Vpp.

FIG. 3 is a diagram illustrating a conventional wordline driver 300. The wordline driver 300 includes a main decoder 310 and a driver 320. The main decoder includes a PMOS transistor 311 that responds to a pre-charge signal PRECH; NMOS transistors 312, 313, 314 and 315 connected in series, that respond to the address decoding signals DRA234, DRA56, DRA78 and DRA91011, respectively; and an inverter 316 that responds to a node A placed between the PMOS transistor 311 and the first NMOS transistor 312. The output of the inverter 316 becomes a normal wordline enable signal NWEi. A driver 320 includes an NMOS transistor 321 which transmits the normal wordline enable signal NWEi to a node B in response to the boosting voltage Vpp, an NMOS transistor 322 which transmits the normal wordline enable signal NWEi to a wordline WLi in response to the sub-wordline signal PXi, an NMOS transistor 323 which transmits the sub-wordline signal PXi to the wordline WLi in response to the voltage of the node B, and an NMOS transistor 324 which discharges the wordline WLi to ground in response to the complementary sub-wordline signal PXiB.

The operation of the MRAD mode illustrated in FIGS. 1 through 3 will be described with reference to the timing diagram of FIG. 4. Referring to FIG. 4, a sub-wordline signal PXi and normal wordline enable signals NWE0, NWE1, NWE2 and so on are generated by receiving address signals ADDR in every row active command interval. The first normal wordline enable signal NWE0 generated in a first row active command interval P1 and the sub-wordline signal PXi generate a wordline WL0 and also selectively generate WL1 through WL3 (not shown). The second normal wordline enable signal NWE1 generated in a second row active command interval P2 and the sub-wordline signal PXi generate a wordline WL4 and selectively generate WL5 through WL7 (not shown). The third normal wordline enable signal NWE2 generated in a third row active command interval and the sub-wordline signal PXi generate a wordline WL8 and selectively generate wordlines WL9 through WL11 (not shown).

In the first row active command interval P1, the first normal wordline enable signal NWE0 of the boosting voltage Vpp is transmitted to the node B of FIG. 3, and subsequently the sub-wordline signal PXi is coupled to the node B by a gate-source capacitance of the NMOS transistor 323, known as a self-boosting phenomenon. Consequently, the node B has a voltage of 2 Vpp−Vt and the first wordline WL0 is at the boosting voltage Vpp.

On the contrary, in the second row active command interval P2, the second normal wordline enable signal NWE1 is at the boosting voltage Vpp and the sub-wordline signal PXi is in an already enabled condition so as to be at the boosting voltage Vpp. Consequently, the node B is at the voltage level of Vpp−Vt. Then, the fifth wordline WL4 is at the voltage level of Vpp−2 Vt. In the same way, the ninth wordline WL8 is at the voltage level of Vpp−2 Vt in the third row active command interval P3.

In other words, during the test in the MRAD mode, the voltage level of the first wordline WL0 is different from that of the subsequent wordlines including the fifth and ninth wordlines WL4 and WL8 and so on, because of the fact that the former is Vpp and the latter are Vpp−2 Vt. If an NMOS transistor is used as a cell transistor, a high voltage must be applied to the cell gate for the purpose of preventing loss of memory cell data. At this time, if the fifth and ninth wordlines WL4 and WL8 are set to be at the Vpp voltage, the first wordline WL0 is at the voltage level of Vpp+2 Vt. Consequently, the first wordline WL0 is over-stressed by 2 Vt compared to the fifth and ninth wordlines WL4 and WL8. Memory cells which are connected to the first wordline WL0 and which are consequently over-stressed, can cause reliability problems with respect to a gate oxide layer.

Therefore, a wordline driver which can prevent a firstly-enabled wordline in which a self-boosting phenomenon occurs from being over-stressed during a test in the MRAD mode, and a corresponding driving method, are needed to overcome such problems.

SUMMARY OF THE INVENTION

The present invention is therefore directed to a wordline driver, and method of driving the wordline driver, which substantially overcome one or more of the problems due to the limitations and disadvantages of the related art.

To solve the above problems, it is an object of the present invention to provide a wordline driver which can apply equal stress to each wordline during a multi-row address disturb test in which a plurality of wordlines are sequentially enabled, so that an equal stress is applied to each of the wordlines.

It is another object of the present invention to provide a corresponding method of driving the wordline driver.

Accordingly, to achieve the first and other objects of the invention, there is provided a wordline driver including a control unit which generates decoder control signals from predetermined signals among externally input address decoding signals in response to signals of a multi-row address disturb (MRAD) mode in which a plurality of wordlines are sequentially enabled, a decoder which generates normal wordline enable signals in response to the address decoding signals and the decoder control signals, and a driver which drives sub-wordline signals generated by combining the address decoding signals as wordlines in response to the normal wordline enable signals. In the multi-row address disturb mode, the wordline enable signals are generated later than the sub-wordline signal.

The control unit may include a first transmitting unit which transmits the address decoding signals in response to the deactivation of the multi-row address disturb signals, a second transmitting unit which transmits the address decoding signals in response to the activation of the multi-row address disturb signals, a delay unit which receives the output of the second transmitting unit and delays it for a predetermined time, and a NOR gate which generates the decoder control signals in response to the output of the first transmitting unit and delay unit.

To achieve the second and other objects of the invention, there is provided a wordline-driving method including transmitting address decoding signals in response to the deactivation of multi row address disturb signals; transmitting the address decoding signals in response to the activation of the multi row address disturb signals; receiving an output of the second step and delaying it for a predetermined time; generating decoder control signals in response to an output of the third step; generating sub-wordline signals through the combination of the address decoding signals; generating normal wordline enable signals in response to the address decoding signals and the decoder control signals; and driving the sub-wordline signals as wordlines in response to the normal wordline enable signals.

According to the present invention, the voltage level of each of the wordlines enabled in the MRAD mode is almost the same as Vpp−2 t. Therefore, it is possible to prevent a wordline which is enabled first in a test performed in a conventional MRAD mode from being over-stressed due to self-boosting.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
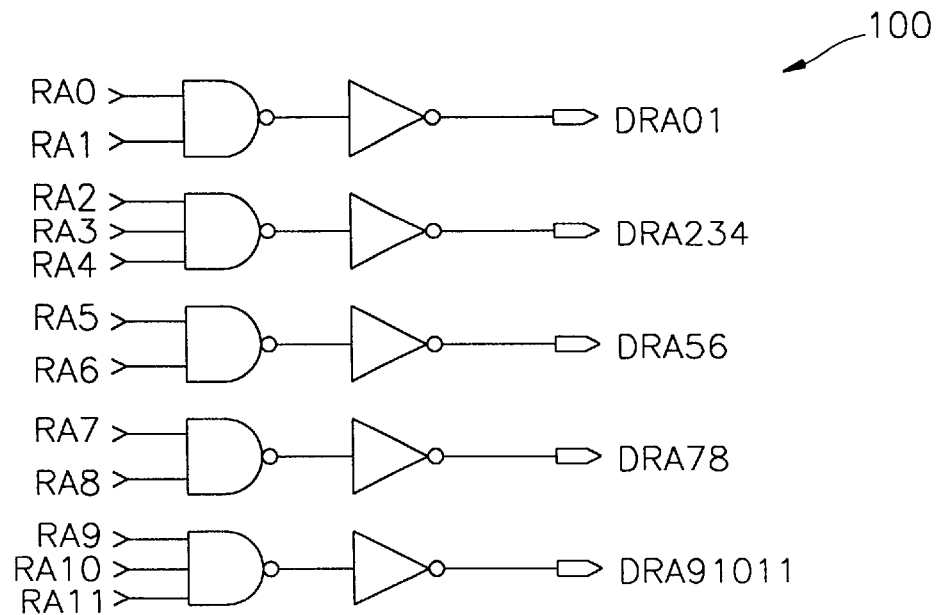
FIG. 1 is a diagram illustrating a conventional row address pre-decoder.

The present invention will now be described more fully with reference to the accompanying drawings, in which preferred embodiments of the invention are shown. These embodiments are provided so that this disclosure will be thorough and complete, and will fully convey the concept of the invention to those skilled in the art. It is also noted that like reference numerals may be used to designate identical or corresponding parts throughout the drawings.

Figure 5:
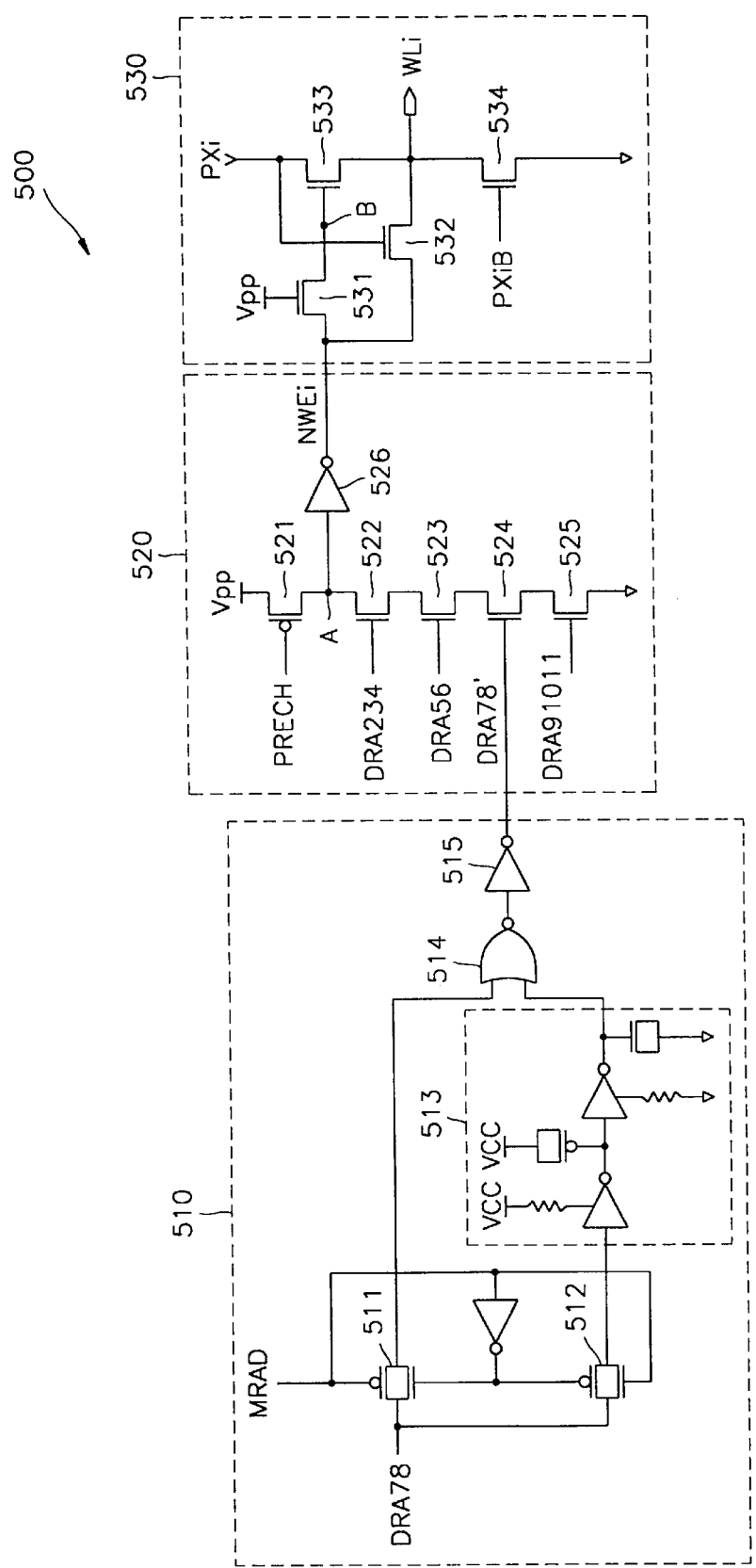
FIG. 5 is a diagram illustrating a wordline driver according to an embodiment of the present invention.

FIG. 5 is a diagram illustrating a wordline driver 500 according to an embodiment of the present invention. The wordline driver 500 includes a control unit 510, a decoder 520 and a driver 530. The control unit 510 receives an address decoding signal DRA78 and generates a decoder control signal DRA78' in response to a multi-row address disturb (MRAD) mode signal.

Specifically, the control unit 510 responds to the MRAD mode signal MRAD when the MRAD mode signal is not active, that is when not in the MRAD mode. In this state, a first transmitting gate 511 is turned on. The address decoding signal DRA78 is transmitted to the input of a NOR gate 514 when the first transmitting gate 511 is turned on. At this time, a second transmitting gate 512 is turned off and the address decoding signal DRA78 is not transmitted to a delay unit 513.

In response to the activation of the MRAD mode signal MRAD of the control unit 510, that is to a logic high level, the second transmitting gate 512 is turned on and the address decoding signal DRA78 is transmitted to the input of the NOR gate 514 via the second transmitting gate 512 and the delay unit 513. The delay unit 513 includes a chain of inverters and delaying devices such as a resistor and a capacitor connected to the output node of each of the inverters. The address decoding signal DRA78 which is passed through the delay unit 513, is delayed for a predetermined time and then it is transmitted to the NOR gate 514. The NOR gate 514 outputs the logic high level of the address decoding signal DRA78 transmitted by the first transmitting gate 511 or that of the delayed address decoding signal DRA78 transmitted by the second transmitting gate 512 as the decoder control signal DRA78' through the inverter 515.

The decoder 520 includes a PMOS transistor 521 that is responsive to a precharge signal PRECH, and NMOS transistors 522, 523, 524, and 525 that are connected in series and that respond to address decoding signals DRA234, DRA56, decoder control signal DRA78' and address decoding signal DRA91011, respectively. The decoder 520 also includes an inverter 526 which responds to a node A placed between the PMOS transistor 521 and the first NMOS transistor 522. The output of the inverter becomes a normal wordline enable signal NWEi.

Figure 2:
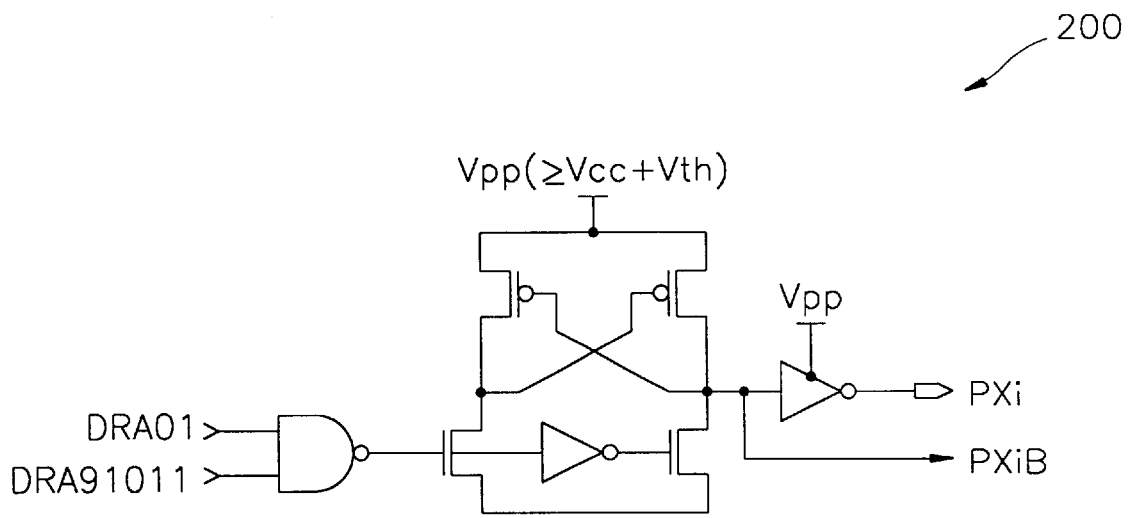
FIG. 2 is a diagram illustrating a conventional sub-wordline decoder.

In the case that the control unit 510 is not in the MRAD mode, the address decoding signals DRA234, DRA56, decoder control signal DRA78' and address decoding signal DRA91011 are respectively applied to the NMOS transistors 522,523,524 and 525 at the same time. In this case, the decoder 520 operates like main decoder 310 of FIG. 3. In the case that the control unit 510 is in the MRAD mode, the address decoding signals DRA234, DRA56, decoder control signal DRA78' and address decoding signal DRA91011 are not simultaneously applied respectively to the NMOS transistors 522, 523, 524 and 525. In this case, the decoder control signal DRA78' is applied later than the address decoding signals DRA234, DRA56 and DRA91011, so that the normal wordline enable signal NWEi should be generated later than the sub wordline signals PXi and PXiB generated by the address decoding signals DRA01 and DRA91011 in the sub decoder 200 illustrated in FIG. 2.

Figure 3:
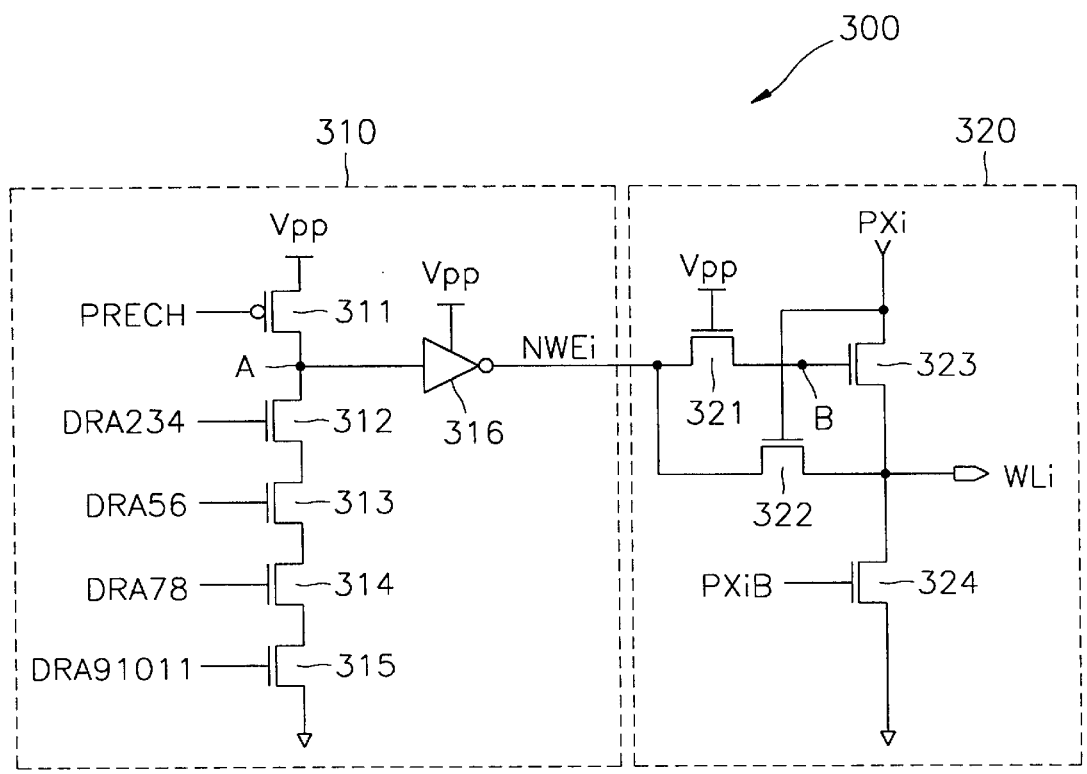
FIG. 3 is a diagram illustrating a conventional wordline driver.
Figure 4:
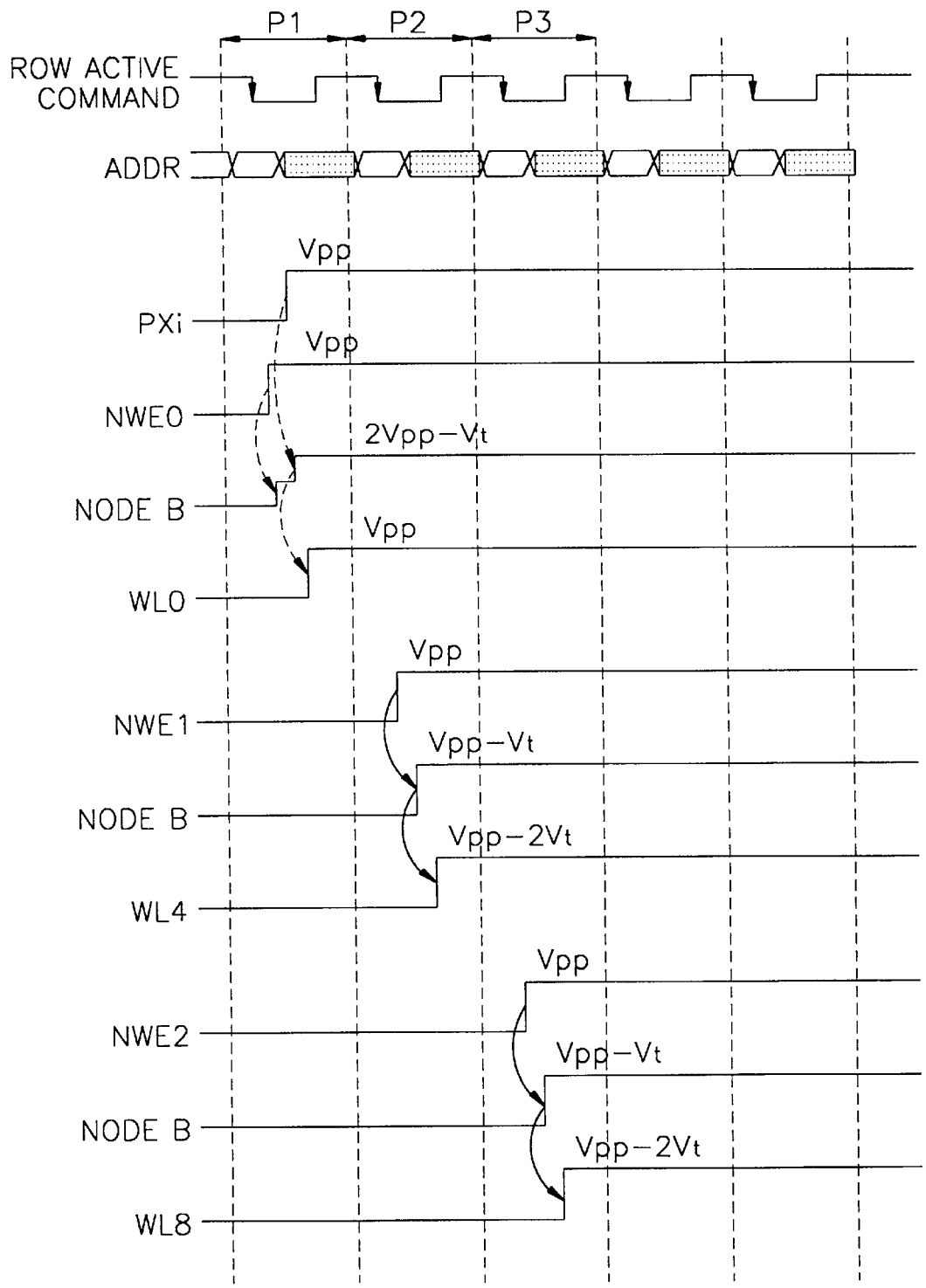
FIG. 4 is a timing diagram showing the operation of the decoders and driver of FIGS. 1 through 3 in a multi row address disturb mode.

Incidentally, driver 530 is substantially the same as the driver 320 illustrated in FIG. 3 and thus its description will be omitted.

Figure 6:
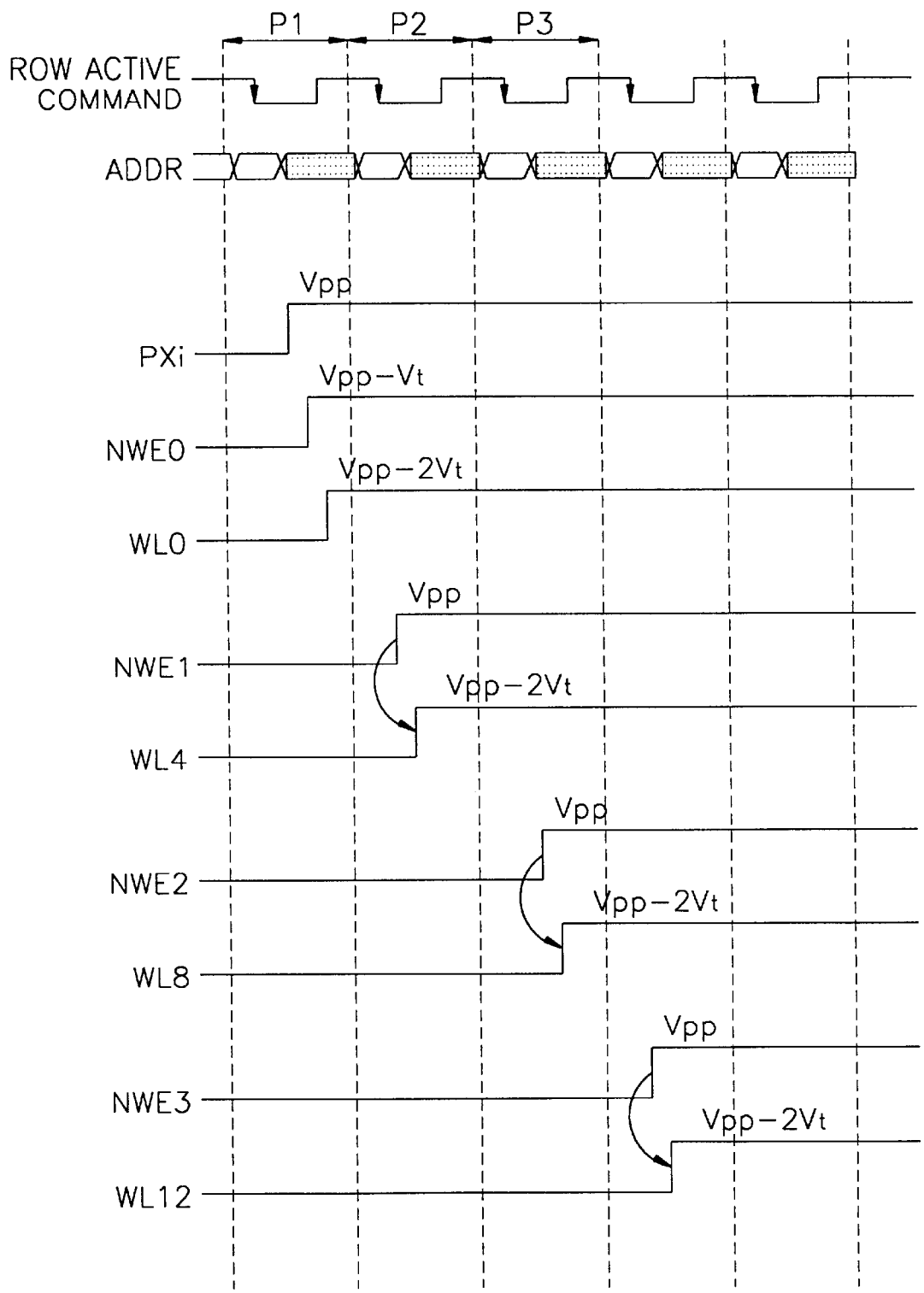
FIG. 6 is a timing diagram showing the operation of the wordline driver illustrated in FIG. 5.

The operation of FIG. 5 will be described with reference to the timing diagram of FIG. 6. First of all, in the MRAD mode, the sub-wordline decoder 200 of FIG. 2 and the decoder 520 of FIG. 5 receive address signals ADDR in every row active command and generate a sub-wordline signal PXi and normal wordline enable signals NWE0, NWE1, NWE2, and so on. In a first row active command interval P1, the sub-wordline signal PXi is generated before the first normal wordline enable signal NWE0. Consequently, a self-boosting phenomenon does not occur and the node B of FIG. 5 is at a voltage level of Vpp–Vt and a first line WL0 is at a voltage level of Vpp–2 Vt.

Later, the second wordline enable signal NWE1 is generated in a second row active command interval P2 after the sub-wordline signal PXi is generated. Consequently, the node B of FIG. 5 is at a voltage level of Vpp–Vt and a fifth wordline WL4 is at a voltage level of Vpp–2 Vt. Also, in the third and fourth row active command intervals P3 and P4, ninth and thirteenth wordlines WL8 and WL12 are at a voltage level of Vpp–2 Vt. Therefore, the voltage levels of the wordlines enabled in the MRAD mode are much the same as a level of Vpp–2 Vt.

The invention being thus described, it will be obvious that the same may be varied in many ways. Such variation are not to be regarded as a departure from the spirit and scope of the invention, and all such modifications as would be obvious to one skilled in the art are intended to be included within the scope of the following claims.

What is claimed is:

1. A wordline driver comprising:
   a control unit that generates a decoder control signal from an address decoding signal provided among externally input plural address decoding signals, responsive to a multi-row address disturb mode signal;
   a decoder that generates a normal wordline enable signal responsive to the plural address decoding signals and the decoder control signal; and
   a driver that drives a sub-wordline signal generated by combining the address decoding signals as a wordline, responsive to the normal wordline enable signal,
   wherein the normal wordline enable signal is generated later than the sub-wordline signal during the multi row address disturb mode.

2. The wordline driver of claim 1, wherein said control unit comprises:
   a first transmitting unit that transmits the address decoding signal responsive to deactivation of the multi-row address disturb mode signal;
   a second transmitting unit that transmits the address decoding signal responsive to activation of the multi-row address disturb mode signal;
   a delay unit that receives and delays an output of said second transmitting unit for a time; and
   a NOR gate that generates the decoder control signal responsive to an output of said first transmitting unit and an output of said delay unit.

3. The wordline driver of claim 2, wherein said delay unit comprises a chain of inverters.

4. The wordline driver of claim 1, wherein said decoder comprises:
   a first transistor, connected to a boosting voltage, that responds to a precharge signal;
   second transistors, connected in series between said first transistor and ground, that respond to the address plural decoding signals and the decoder control signal, respectively; and
   an inverter, having an input coupled to a node between said first transistor and said second transistors, that generates the normal wordline enable signal.

5. The wordline driver of claim 1, wherein said driver comprises:
   a first transistor that transmits the normal wordline enable signal responsive to a boosting voltage;
   a second transistor that transmits the sub-wordline signal to the wordline responsive to an output of said first transistor;
   a third transistor that transmits the normal wordline enable signal responsive to the sub-wordline signal; and
   a fourth transistor that discharges the wordline to ground responsive to the sub-wordline signal.

6. The wordline driver of claim 1, wherein the address decoding signals are generated by a pre-decoder that selectively combines externally input address signals.

7. A method of driving a wordline driver comprising:
   transmitting an address decoding signal responsive to deactivation of a multi row address disturb mode signal, to provide a first signal;
   transmitting the address decoding signal responsive to activation of the multi row address disturb mode signal, to provide a second signal;
   receiving and delaying the second signal for a time, to provide a third signal;
   generating a decoder control signal responsive to the first and-third signals;
   generating a sub-wordline signal by combining address decoding signals;
   generating a normal wordline enable signal responsive to the address decoding signals and the decoder control signal; and
   driving the sub-wordline signal as a wordline responsive to a normal wordline enable signal.

8. The method of driving a wordline driver of claim 7, wherein the normal wordline enable signal is generated later than the sub-wordline signal.

9. A method of driving a wordline comprising:

generating a decoder control signal from an address decoding signal provided among externally input plural address decoding signals, responsive to a multi-row address disturb mode signal;

generating a normal wordline enable signal responsive to the plural address decoding signals and the decoder control signal; and driving a sub-wordline signal generated by combining the address decoding signals as a wordline, responsive to the normal wordline enable signal, wherein the normal wordline enable signal is generated later than the sub-wordline signal during the multi row address disturb mode.

10. The method of driving a wordline of claim 9, wherein said generating a decoder signal comprises:

transmitting the address decoding signal as a first signal responsive to deactivation of the multi-row address disturb mode signal;

transmitting the address decoding signal as a second signal responsive to activation of the multi-row address disturb mode signal;

delaying the second signal for a time, to provide a third signal; and generating the decoder control signal responsive to the first and third signals.

11. The method of driving a wordline of claim 10, wherein said generating a decoder control signal comprises performing a logical NOR operation on the first and third signals, to provide the decoder signal.

* * * * *